United States Patent [19]

Kendall

[11] Patent Number: 5,532,903
[45] Date of Patent: Jul. 2, 1996

[54] MEMBRANE ELECTROSTATIC CHUCK

[75] Inventor: Rodney A. Kendall, Fairfield County, Conn.

[73] Assignee: International Business Machines Corporation, Armonk, N.Y.

[21] Appl. No.: 434,092

[22] Filed: May 3, 1995

[51] Int. Cl.[6] .................................................. H02N 13/00
[52] U.S. Cl. ........................................................ 361/234
[58] Field of Search ......................... 361/234; 279/128; 269/8

[56] References Cited

U.S. PATENT DOCUMENTS

| | | |
|---|---|---|
| 3,974,382 | 8/1976 | Bernacki . |
| 4,610,020 | 9/1986 | La Fiandra . |
| 5,275,683 | 1/1994 | Arami et al. . |
| 5,382,311 | 1/1995 | Ishikawa et al. ...................... 156/345 |

OTHER PUBLICATIONS

Kendall. "Double–Sided Electrostatic Chunk" *IBM Technical Disclosure Bulletin* vol. 32 No. 5B Oct. 1989.

*Primary Examiner*—Fritz M. Fleming
*Attorney, Agent, or Firm*—Whitham, Curtis, Whitham, & McGinn; Charles W. Peterson, Jr.

[57] ABSTRACT

An electrostatic chuck for high vacuum operations and the like includes a membrane that allows conformal, full surface, electrostatic clamping to prevent substrate slippage and in-plane distortion. Because clamping of the substrate is performed with an electrostatic membrane chuck, the membrane is permitted to conform to the clamping surface of non-planar substrates. Thus, the substrate can be firmly held electrostatically without causing in-plane distortion.

6 Claims, 2 Drawing Sheets

MEMBRANE ELECTROSTATIC CHUCK

BACKGROUND OF THE INVENTION

1. Field of the Invention

The invention is generally related to electrostatic chucks used in high vacuum applications for patterning and processing substrates such as semiconductor chips and wafers. More particularly, the invention is concerned with reducing in-plane distortion of masks when utilizing an electrostatic chuck.

2. Description of the Prior Art

Electrostatic chucking of substrates is a process whereby an electric potential is applied between a substrate and a chuck is used to secure the substrate in place on the chuck during patterning of the substrate, or, in the case where the substrate is a mask, during patterning of a chip or wafer or the like with the chucked mask. The electric potential is maintained during patterning such that the chucked substrate or mask is held in place with a precisely maintained and controlled x-y position. After patterning, the chucked substrate or mask can simply be removed by terminating the flow of electric potential.

An early example of electrostatic chucking of a substrate is shown in U.S. Pat. No. 3,974,382 to Bernacki. In Bernacki, a lithographic mask is attracted to the surface of an X-ray sensitive polymer by depositing the mask on the surface of the polymer, and then passing a current through the mask to a ground block. The electricity causes the mask to be brought into intimate contact with the X-ray sensitive polymer and deform to the slight irregularities of the surface of the X-ray sensitive polymer. X-ray lithography is no longer being done in the manner prescribed in Bernacki. In particular, today's technology requires that the mask not be distorted, and that the mask not be brought into contact with the wafer.

"Single-sided" and "double-sided" electrostatic chucks are discussed in detail in Kendall, IBM Technical Disclosure Bulletin, Vol. 32, No. 5B, October, 1989. FIG. 1 shows a "single-sided" chuck 1 that is fastened to process equipment 2 using hold-down screws 3 or the like. The substrate 5 is held in position on the chuck 1 by applying a voltage from source 6 to the electrode 7 on the chuck 1 thereby generating an electric field through dielectric 8. FIG. 2 shows a "double sided" chuck where two chucks 9 and 10 are placed back-to-back with ground plane 17 between them. The dielectric layer 12 and electrode 13 form chuck 9 which secures the substrate 11 to the chuck 9. The dielectric layer 15 and electrode 16 form the second chuck 10 which secures the entire assembly to the piece of equipment 18 (e.g., X-Y stage) in which it is being used. The two chucks are separated by the ground plane or layer 17 which prevents fields generated by one of the electrodes from protruding into the region of the other electrode. In operation in a high vacuum system, the lower electrode is powered on first to secure the chuck 10 to the process equipment 18. A substrate 11 is placed on the chuck 9 and secured there by powering on the upper electrode. The substrate 11 can then be processed. After processing, the substrate 11 can be exchanged by powering down the upper electrode, and then powering up the upper electrode once a new substrate is added. The lower chuck electrode remains powered-on throughout these operations to prevent any movement of the chuck. When chuck removal is necessary, the lower electrode is powered off to allow release.

U.S. Pat. No. 5,275,683 to Arami et al. discloses a method to for increasing the clamping force of a rigid electrostatic chuck. In Arami et al., an electrostatic chuck sheet comprised of a conductive film is sandwiched between two larger dielectric films and placed on top of the mount body or susceptor. The larger dielectric films are bonded together at their ends which extend beyond the conductive film, and the bonded regions are positioned on a curved portion of the susceptor angled away from the substrate. The arrangement prevents concentration of the electric field on the rim section.

A problem with all prior art electrostatic chuck designs is that they do not accommodate the non-planar character of the surfaces of many of the masks or substrates which are to be clamped. FIG. 3 shows a rigid chuck 20 on which is positioned a slightly bowed X-ray ring 22 which is to be electrostatically clamped. It should be understood that the chuck 20 can be a single-sided or the top portion of a double sided chuck, and that many other substrates besides X-ray ring 22 can be electrostatically clamped, and would have the same problem as set forth below. The clamping face 24 of the X-ray ring 22 does not lay fiat on the rigid chuck 20. Thus, when the electric field is applied, the clamping action, indicated by arrow 26 and generated by the attractive force between the chuck 20 and X-ray ring 22, causes the clamping face 24 to flatten or conform against the rigid chuck 20. This clamping action 26, in turn, causes in-plane distortion of the mask 28 at the pattern area (not shown). For exemplary purposes, if the substrate is an X-ray ring, and the gap 25 between the chuck 20 and ring 22 were on the order of 4–5 microns, the clamping action 26 would produce motion at the perimeter of the mask on the order of 4–5 microns in the mask, and this would produce hundreds of nanometers of in-plane distortion in the pattern area.

U.S. Pat. No. 4,610,020 to La Fiandra discloses an X-ray mask ring which has been specially machined to accommodate a plurality of kinematic mounts for mounting the ring on an alignment cartridge. Mechanical clamping schemes are commonly used in e-beam and x-ray tools; however, the clamping is not electrostatic, and requires special mechanical features on the substrate and/or clamping device.

It would be advantageous to provide an electrostatic clamp, which has the advantages of not requiring special features to be machined into a substrate and not requiring mechanical operations to be performed for removal and replacement of substrates in the clamp, but which accommodates and addresses the in-plane distortion problem which results when the substrate clamping surface is not planar.

SUMMARY OF THE INVENTION

It is an object of this invention to provide an improved electrostatic clamping assembly which has high transverse stiffness, but low axial stiffness, thereby allowing rigid constrainment of substrates in the X and Y directions, but imposing no significant clamping forces in the Z dimension which would distort the substrate.

It is another object of this invention to provide an improved electrostatic damping assembly which minimizes axial distortion of the mask or substrate being damped.

According to the invention, an electrostatic chuck is formed on a membrane. The membrane can conform to the clamping surface of a non-planar substrate, such as a bowed X-ray ring or the like; rather than requiring the substrate to conform to the surface of the chuck. The membrane is advantageously used as part of a double sided electrostatic chuck where the lower chuck assembly is used to clamp the assembly to process equipment such as an X-Y stage. The membrane may be stretched over one or more height reference pads designed to position the substrate at the correct height when loaded into a tool.

BRIEF DESCRIPTION OF THE DRAWINGS

The foregoing and other objects, aspects and advantages will be better understood from the following detailed description of the preferred embodiments of the invention with reference to the drawings, in which.

DETAILED DESCRIPTION OF THE PREFERRED EMBODIMENTS OF THE INVENTION

Figure 4:
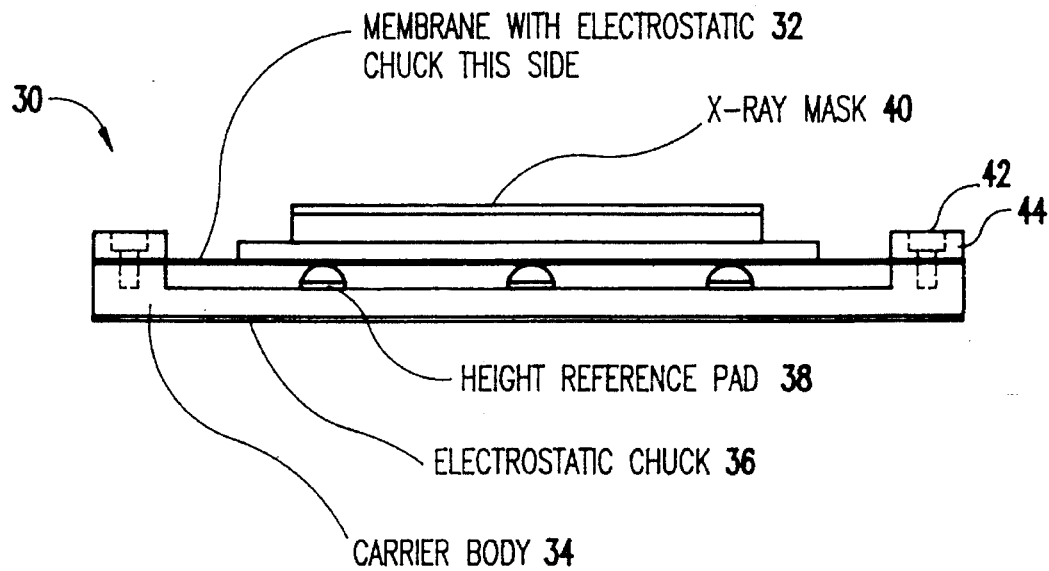
FIG. 4 is a cross-sectional side view of the membrane double-sided electrostatic chuck of the present invention.

FIG. 4 shows a membrane double-sided electrostatic chuck 30 according to the present invention which allows repeatable, distortion free clamping of substrates. While FIG. 4 shows a double-sided electrostatic chuck, it should be understood that an important and novel feature of this invention is the membrane 32 which allows conformal, full surface electrostatic clamping to prevent substrate slippage, and that the membrane 32 of the present invention might advantageously be employed in other assemblies which do not include a second electrostatic chuck member.

In FIG. 4, a carrier body or housing 34 includes a conventional electrostatic chuck 36 on its bottom surface for clamping the carrier 34 to a processing tool or stage (not shown). As noted above, the carrier 34 might be secured to a stage by a variety of other electrical or mechanical means such as, for example, hold-down pins or the like.

Inside the axial opening of the carrier body 34 on its upper surface are one or more height reference pads 38. The membrane 32 is stretched across the height reference pads 38. The height reference pads 38 should be sized to position the surface of the substrate 40, which can be an x-ray mask, photomask, wafer, or the like, at the correct height when loaded into a tool (not shown), such as an E-Beam tool, measurement tool, or other processing tool. The height of the pads 38 will vary depending on the tool and the substrate. The reference pads 38 should not interfere with axial movement of the membrane 32 or distort the membrane 32. Reference pads 38 with rounded top surfaces are preferred and should present less strain on the membrane 32. In addition, when a plurality of reference pads are being used, as is shown in FIG. 4, the reference pads should all have the same height such that the membrane 32 is not distorted upward in different locations.

It is also possible that the reference pads 38 protrude through holes (not shown) placed in the membrane 32 so as to support the mask directly without contacting the membrane 32.

The outer perimeter of the membrane 32 can be secured to the carrier body 34 by a wide variety of devices. FIG. 4 shows an embodiment where screws 42 protrude through holes in the membrane and secure a top member 44 to the carrier body 34. However, the membrane 32 could also be held by pinching between the top member 44 and carrier body 34, or, alternatively, the top member 44 might be eliminated, and the membrane 32 could be secured to the carrier body by adhesive bonding or by other means.

Although not shown in FIG. 4, one or more power supplies and electrical connections to the membrane electrostatic chuck 32 and base electrostatic chuck 36 are provided, as is conventional in electrostatic chucking.

Figure 1:
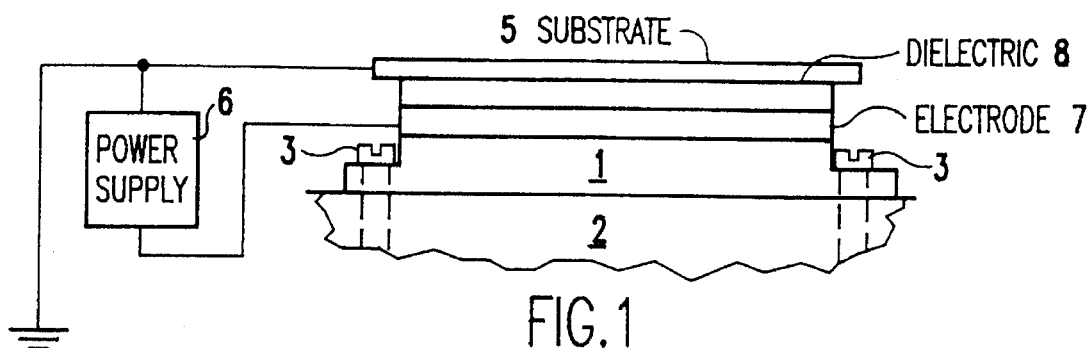
FIG. 1 is a cross-sectional side view of a prior art "single-sided" electrostatic chuck.
Figure 2:
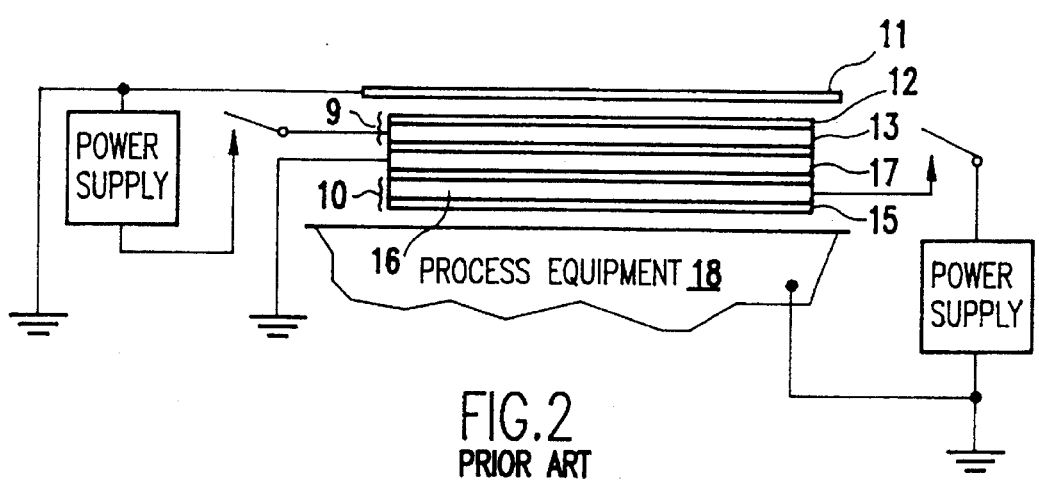
FIG. 2 is a cross-sectional side view of a prior art "double-sided" electrostatic chuck.
Figure 3:
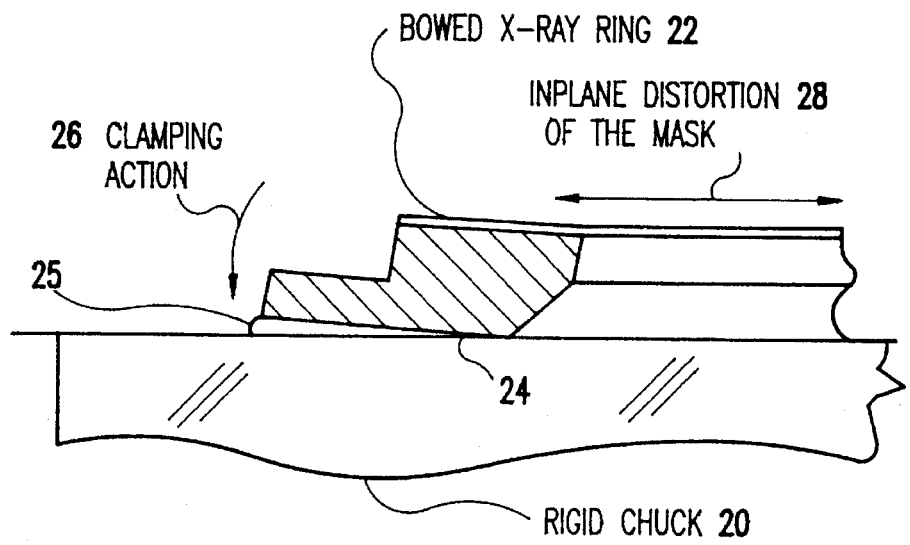
FIG. 3 is a cross-sectional side view of a rigid electrostatic chuck illustrating an in-plane distortion problem.
Figure 5:
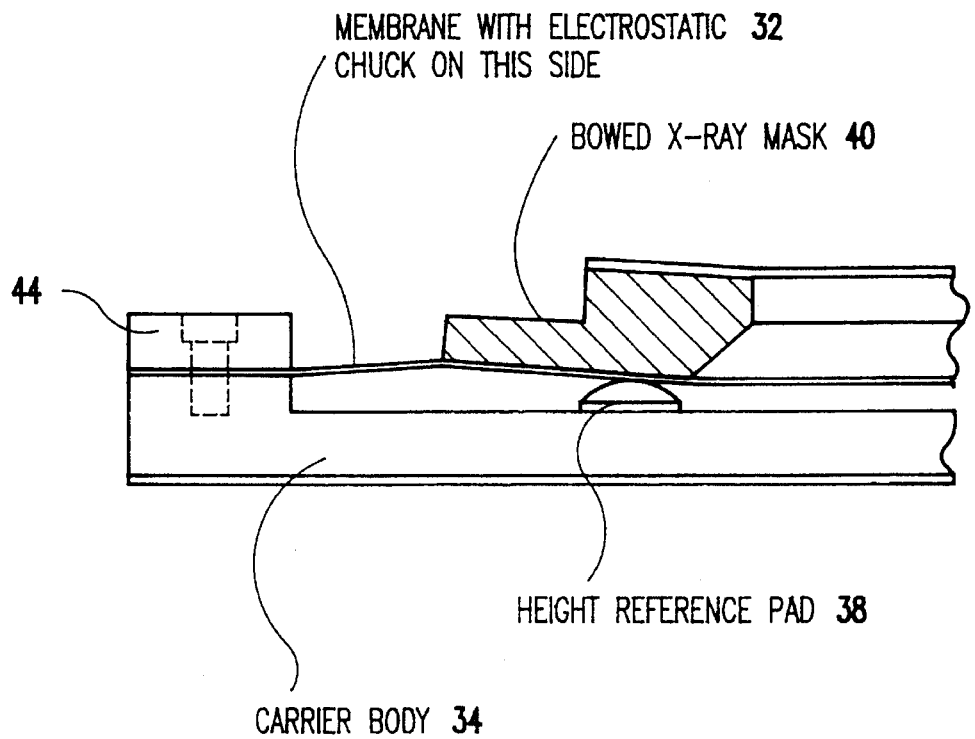
FIG. 5 is a cross-sectional side view of the membrane double-sided electrostatic chuck of FIG. 4 showing the membrane chuck conforming to the substrate.

FIG. 5 demonstrates an important attribute of the membrane electrostatic chuck 32. In particular, with reference back to the bowed X-ray ring shown in FIG. 3, it can be seen that when the same bowed X-ray ring is positioned on the membrane electrostatic membrane chuck 32 of the present invention, the membrane 32 conforms to the substrate or mask 40 during electrostatic chucking, rather than causing the substrate or mask 40 to conform to a rigid chuck. Thus, in-plane distortion in the pattern areas of the mask 40 are avoided.

The membrane 32 could be made from a wide variety of materials including glass, polymer, or metal. The membrane includes an electrically conductive component to accomplish the electrostatic chucking with the substrate. The membrane can have many forms including a conductive sheet sandwiched between dielectric materials, a conductive electrode pattern sandwiched between dielectric materials, an electrically conductive powder or material distributed between or within dielectric materials, etc. The size of the membrane will vary in accordance with the type of substrates to be chucked, and with the type of tools in which the chuck will be placed. The membrane is designed to accommodate X-ray masks, photomasks, wafers, and other types of substrates which are to be electrostatically chucked for high vacuum operations. To accommodate substrate bow, the membrane 32 must accommodate some transverse strain if the membrane chuck is perfectly flat in the neutral state. The amount of strain will vary with the type of operation being performed and the type of substrate being chucked. For example, for an X-ray mask with 5 microns of bow, the transverse strain in the membrane can be only 3 nanometers across a 158 mm membrane diameter.

While the invention has been described in terms of its preferred embodiments, those skilled in the art will recognize that the invention can be practiced with modification within the spirit and scope of the appended claims.

I claim:

1. An electrostatic chuck assembly, comprising:

a housing with an axial opening;

an electrostatic membrane positioned across said axial opening of said housing; and means for securing said electrostatic membrane to said housing only at perimeter edges of said axial opening of said housing, whereby said electrostatic membrane is translatable in said axial direction relative to said axial opening of said housing during electrostatic chucking of a substrate to an electrostatic membrane.

2. The electrostatic chuck assembly of claim 1 further comprising at least one height reference pad positioned in said axial opening of said housing, said electrostatic membrane contacting said at least one height reference pad.

3. The electrostatic chuck assembly of claim 1 further comprising a plurality of height reference pads positioned in said axial opening of said housing, said electrostatic membrane contacting said plurality of height reference pads.

4. The electrostatic chuck assembly of claim 1 wherein said means for securing includes a plurality of pins positioned through perimeter regions of said electrostatic membrane into said housing.

5. The electrostatic chuck assembly of claim 1 further including a clamping member positioned on a first side of said electrostatic membrane at a perimeter region, said housing being positioned on a second side of said electrostatic membrane, and means for holding said electrostatic membrane between said clamping member and said housing.

6. The electrostatic chuck assembly of claim 1 further comprising an electrostatic chuck positioned on said housing.

* * * * *